US008232883B2

(12) United States Patent
Yao et al.

(10) Patent No.: US 8,232,883 B2
(45) Date of Patent: Jul. 31, 2012

(54) OPTICAL PROXIMITY SENSOR WITH IMPROVED SHIELD AND LENSES

(75) Inventors: Yufeng Yao, Singapore (SG); Chi Boon Ong, Singapore (SG); Sze Ping Ong, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 330 days.

(21) Appl. No.: 12/631,793

(22) Filed: Dec. 4, 2009

(65) Prior Publication Data

US 2011/0133941 A1    Jun. 9, 2011

(51) Int. Cl.
*G08B 17/12* (2006.01)
(52) U.S. Cl. ........................................ 340/600; 359/619
(58) Field of Classification Search .................. 340/600
See application file for complete search history.

(56) References Cited

U.S. PATENT DOCUMENTS

| 6,324,008 | B1 | 11/2001 | Baldwin et al. |
| 7,728,316 | B2* | 6/2010 | Fadell et al. ............. 250/559.38 |
| 2009/0027652 | A1* | 1/2009 | Chang et al. ................. 356/4.01 |
| 2009/0115705 | A1 | 5/2009 | Miller et al. |
| 2011/0121182 | A1* | 5/2011 | Wong et al. .................... 250/340 |

FOREIGN PATENT DOCUMENTS

WO    WO 2008066645 A2    6/2008

OTHER PUBLICATIONS

"Infrared Proximity Sensing: Evaluating the Design Trade-Offs," Yong Luo and Tamara Schmitz, Interstil Corp., embedded.com, Nov. 24, 2009.

* cited by examiner

*Primary Examiner* — George Bugg
*Assistant Examiner* — Kerri McNally (57) ABSTRACT

Various embodiments of an optical sensor comprising a novel shield that may be quickly and accurately aligned and positioned with respect to an underlying light emitting and light detecting assembly are disclosed. Also disclosed are novel lens arrangements for efficiently collimating light emitted and received by the optical proximity sensor, and for reducing crosstalk.

25 Claims, 7 Drawing Sheets

OPTICAL PROXIMITY SENSOR WITH IMPROVED SHIELD AND LENSES

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of handheld electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Figure 1:
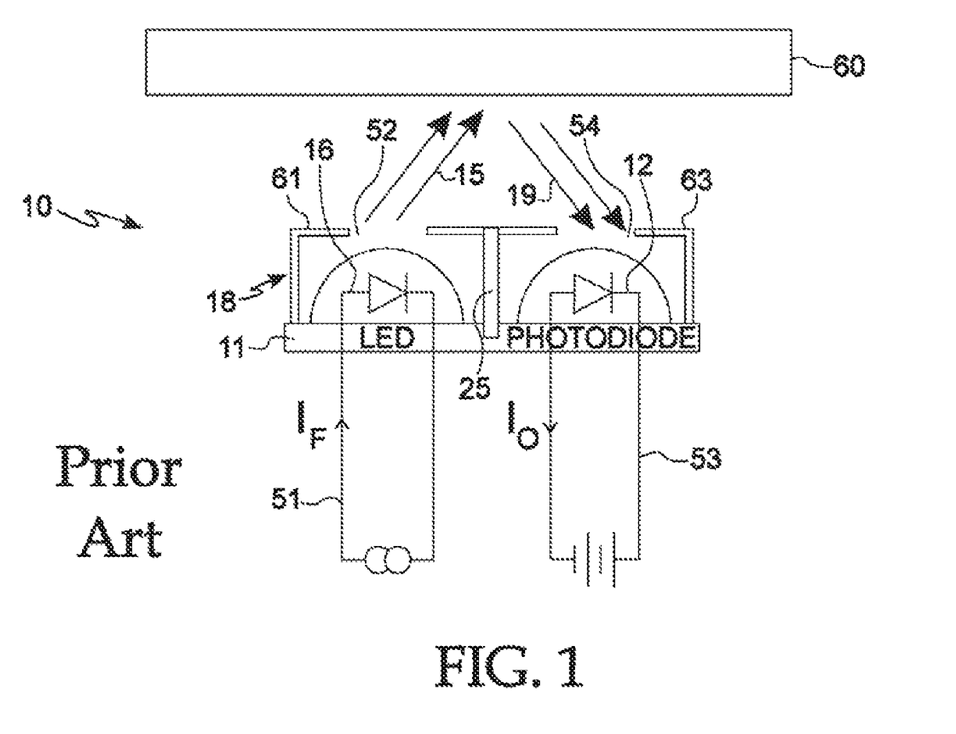
FIG. 1 shows a prior art optical proximity sensor and associated circuitry.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 52 and 54, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1, optical proximity sensor 10 further comprises metal housing or shield 18 formed of metal and comprising apertures 52 and 54 located over light emitter 16 and light detector 12, respectively, such that at least a first portion of light 15 emitted by light emitter 16 passes through aperture 52, and at least a second portion of the first portion 19 of light reflected from object to be detected 60 passes through aperture 54 for detection by light detector 12. As shown, metal housing or shield 18 may further comprise first and second top portions beneath which light emitter 16 and light detector 12 are disposed, respectively. Disposed between and beneath first and second top portions 61 and 63 comprise are optically opaque metal inner sidewalls 25 to provide optical isolation between light emitter 16 and light detector 12.

Many optical proximity sensors generally include a metal shield, such as shield or housing 18 of the type shown in FIG. 1, to provide optical isolation between light emitter 16 and light detector or photodiode 12 so that undesired optical cross-talk between emitter 16 and detector 12 is minimized. See, for example, the Data Sheets corresponding to the AVAGO TECHNOLOGIES™ APDS-9120 Integrated Optical Sensors Preliminary Datasheet and the AVAGO TECHNOLOGIES™ APDS-9800 Integrated Ambient Light and Proximity Sensors Preliminary Datasheet, each of which is hereby incorporated by reference herein, each in its respective entirety.

Figure 2:
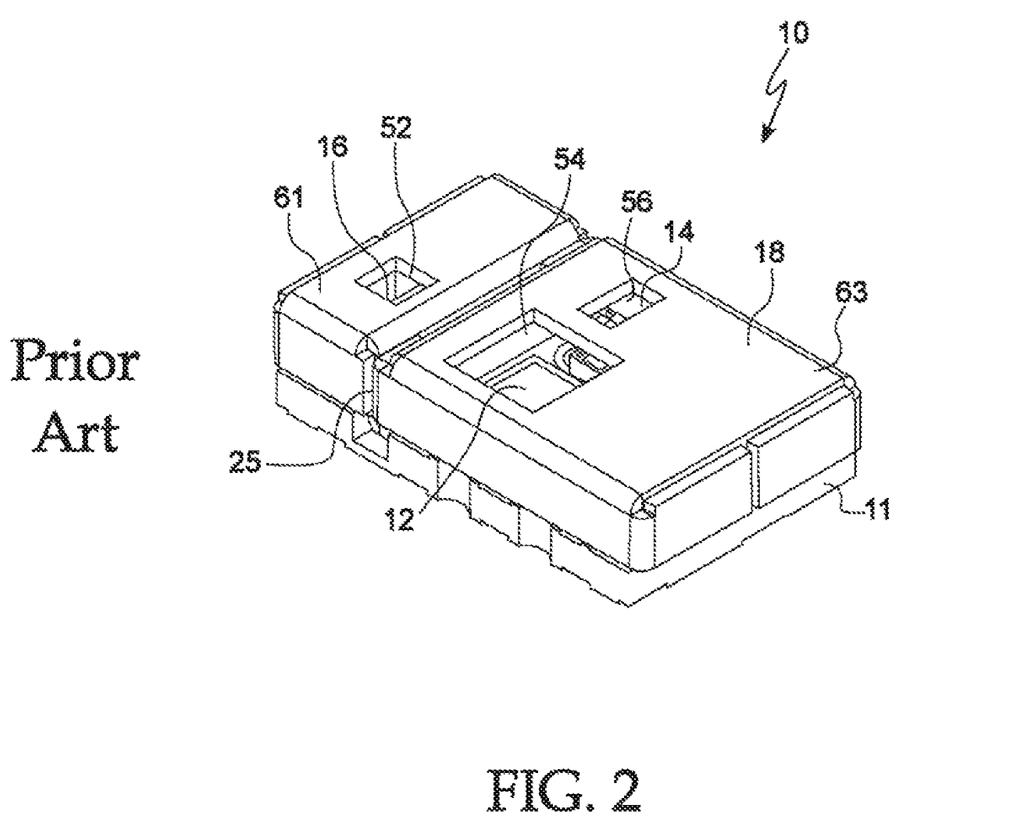
FIG. 2 shows a perspective view of an assembled prior art optical proximity sensor.

FIG. 2 shows a prior art optical proximity sensor 10 with a relatively complicated metal shield or housing 18. The optical proximity sensor shown in FIG. 2 is an AVAGO TECHNOLOGIES™ APDS-9800 Integrated Ambient Light and Proximity Sensor, which contains a printed circuit board ("PCB") or substrate 11 upon which are mounted LED 16, light detector or photodiode 12, and ambient light sensor 14. Two-piece metal shield 18 covers LED 16, light detector or photodiode 12, and ambient light sensor 14 and contains a downwardly projecting light barrier 25 disposed therebetween. In the APDS-9800 optical proximity sensor, metal shield 18, being of a considerably complicated shape and geometry, is formed and thinned using progressive metal stamping techniques, and must be hand-fitted and attached to the underlying PCB by gluing to ensure proper alignment and fit.

Note that APDS-9800 sensor 10 of FIG. 2 does not include any lenses disposed over light emitter 16, light detector 12, or ambient light sensor 16. As discussed in more detail below, it has been discovered that the lack of collimating lenses on devices such as the APDS-9800 sensor results in substantial performance losses, as some light emitted by the sensor is unfocused and subsequently dissipates, and some light emitted by sensor 10 is lost to dispersive effects. Light loss is further exacerbated by windows in portable electronic devices having low optical transmittances or themselves generating unacceptably high levels of crosstalk. All these factors reduce the distance at which objects may be detected by an optical proximity sensor.

As will now be seen, at least some optical proximity sensors of the prior art have metal shields 18 which are difficult or time-consuming to fit. In addition, at least some optical sensors of the prior art exhibit excessive crosstalk and poor optical efficiency, both of which factors reduce the effective distance at which objects may be detected by such sensors. In addition, the commercial marketplace demands ever smaller portable electronic devices. This of course means there exists a motivation to make optical proximity sensors ever smaller.

What is need is an optical proximity sensor design that results in a metal shield that can be accurately and quickly placed on the sensor during the manufacturing process, that exhibits decreased crosstalk and increased detection distance, and that features improved performance, lower cost, increased manufacturability and improved reliability. What is also needed is a smaller optical proximity sensor.

SUMMARY

In some embodiments, there is provided an optical proximity sensor comprising an infrared light emitter mounted on a substrate, an infrared light detector mounted on the substrate, an integrated circuit mounted on the substrate and comprising light emitter driving and light detecting circuits operably connected to the light emitter and the light detector, respectively, a first spherical lens disposed over the light emitter and configured to collect and direct light emitted by the light emitter in an upward direction towards an object to be detected, a second spherical lens disposed over the light detector and configured to collect and direct light incident thereon that has been transmitted upwardly by the first lens and reflected downwardly from the object to be detected towards the light detector, and a light shield disposed over the light emitter, the light detector, the first lens and the second lens, the light shield comprising first and second top portions, a light barrier projecting downwardly between the first and second top portions to separate the light emitter from the light detector and divide the proximity sensor into light emitting and light detecting portions, at least one light shield alignment and spacing member projecting downwardly from either the first portion or the second portion, and first and second apertures disposed through the first and second portions over the first and second lenses, respectively, where alignment of the shield over the proximity sensor is optimized by the light barrier and the at least one light shield alignment and spacing member, crosstalk between the light emitter and the light detector is minimized, and detection distance of the proximity sensor is maximized by the configurations of the light emitter, the first lens, the light detector, the second lens, and the shield respecting one another.

In other embodiments, there is provided a method of making an optical proximity sensor comprising mounting an infrared light emitter on a substrate, mounting an infrared light detector on the substrate, mounting an integrated circuit comprising light emitter driving and light detecting circuits on the substrate and operably connecting the circuits to the light emitter and the light detector, placing or forming a first spherical lens over the light emitter, the first lens being configured to collect and direct light emitted by the light emitter in an upward direction towards an object to be detected, placing or forming a second spherical lens over the light emitter, the second lens being configured to collect and direct light incident thereon that has been transmitted upwardly by the first lens and reflected downwardly from the object to be detected towards the light detector, and disposing a light shield over the light emitter, the light detector, the first lens and the second lens, the light shield comprising first and second top portions, a light barrier projecting downwardly between the first and second top portions to separate the light emitter from the light detector and divide the proximity sensor into light emitting and light detecting portions, at least one light shield alignment and spacing member projecting downwardly from either the first top portion or the second top portion, and first and second apertures disposed through the shield over the first and second lenses, respectively, where alignment of the shield over the proximity sensor is optimized by the light barrier and the at least one light shield alignment and spacing member, crosstalk between the light emitter and the light detector is minimized, and detection distance of the proximity sensor is maximized, by the configurations of the light emitter, the first lens, the light detector, the second lens, and the shield respecting one another.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

In the following Detailed Description, reference is made to the accompanying drawings, which form a part hereof, and in which are illustrated specific embodiments according to which the invention may be practiced. In this regard, directional terminology, such as "top," "bottom," "atop," "beneath," "forward," "backward," "side," "front," "back," etc., is used with reference to the orientation of the Figures being described. Because the components of various embodiments of the invention may be positioned in a number of different orientations, the directional terminology is used for purposes of illustration and is in no way limiting. It is to be understood that other embodiments may be utilized, and that structural or logical changes may be made without departing from the scope of the present invention. The following Detailed Description, therefore, is not to be taken in a limiting sense, and the scope of the present invention is defined by the appended claims.

Figure 9:
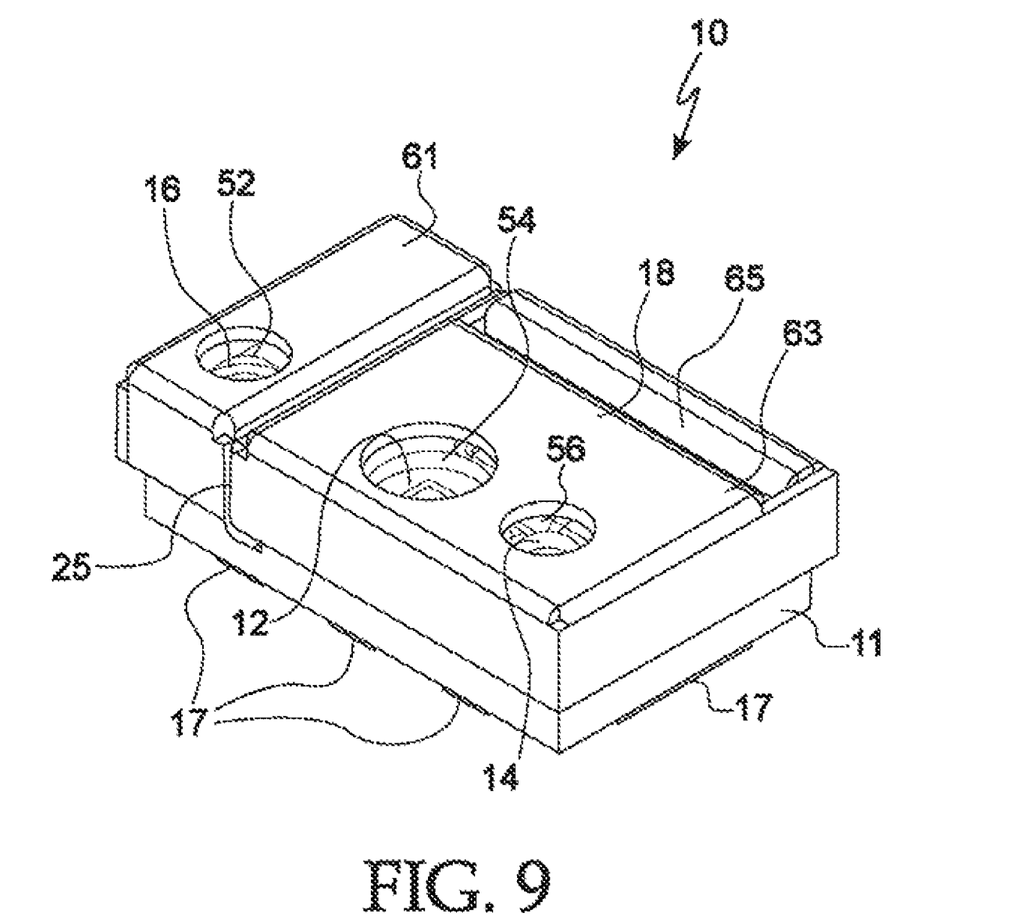
FIG. 9 shows a top perspective view of fully assembled lensed proximity sensor 10 with shield 18 disposed thereover.

Referring to FIGS. 3 through 9, there are is shown one embodiment of optical proximity sensor 10 and its various components. The complete optical proximity sensor of such an embodiment is shown in FIG. 9. As will become apparent, the embodiment of optical proximity sensor 9 shown in FIGS. 3 through 9 overcomes many of the problems associated with prior art optical proximity sensors by providing an easily mounted and accurately aligned shield 18 that may be accurately and quickly affixed to proximity sensor 10, increasing the distance at which object 60 can be detected, reducing undesired crosstalk between light emitter 16 and light detector 12, reducing the overall size, volume and footprint of optical proximity sensor 10, and reducing manufacturing and material costs associated therewith. By way of example, in one embodiment optical sensor 10 shown in FIG. 9 may be configured to have dimensions of about 4.0 mm×3.0 mm×1.1 mm. Other advantages of the embodiment of the optical proximity sensor 10 illustrated in FIGS. 3 though 9 will become apparent to those skilled in the art upon having read, understood and considered the present specification and drawings.

Figure 3:
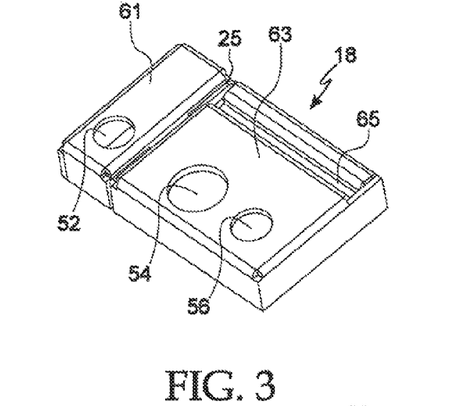
FIG. 3 shows a top perspective view of one embodiment of a shield 18 for an optical proximity sensor.
Figure 4:
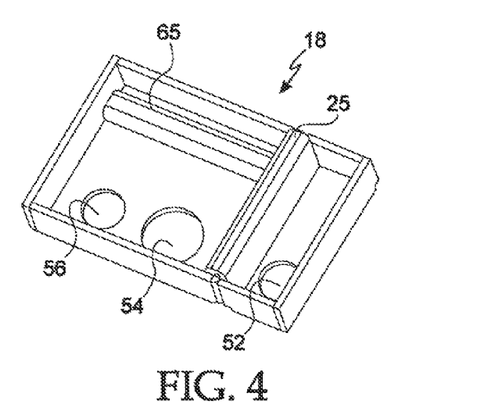
FIG. 4 shows a bottom perspective view of one embodiment of a shield 18 for an optical proximity sensor.

Referring now to FIGS. 3 and 4, there are shown top perspective and bottom perspective views, respectively, of one embodiment of shield 18. As illustrated, apertures 52, 54 and 56 are disposed through top portions 61 and 63 of shield 18, and are configured to be positioned directly over light emitter 16, light detector 12, and ambient light sensor 14 mounted on or attached to substrate 11 (see FIGS. 7 and 8). Light barrier 25 projects downwardly between portions 61 and 63 to minimize the occurrence of crosstalk between light emitter 12 on the one hand, and ambient light sensor 14 and light detector 12 on the other hand, and separates proximity sensor 10 into a light emitting portion comprising light emitter 16 and a light detecting portion comprising light detector 12 and ambient light sensor 14, thereby contributing to the minimization of crosstalk between light emitter 16 and light detector 12 (and ambient light sensor 14).

As further shown in FIGS. 3 through 8, light shield alignment and spacing member 65 projects downwardly from second portion 63 for positioning over a light detecting portion of proximity sensor 10 (which includes light detector 12 and ambient light sensor 14). Light barrier 25 also projects downwardly from first portion 61 of shield 18, and is configured to extend downwardly into channel 72 formed between the light emitting and light detecting portions of proximity sensor 10.

Light barrier 25 and light shield alignment and spacing member 65 are together configured and arranged so that when shield 18 placed over and upon underlying shieldless assembly 20 of proximity sensor 10, shield 18 accurately and automatically registers itself upon and over underlying shieldless assembly 20 in a stable fashion. Such a configuration and arrangement results in shield 18 self-aligning and registering itself when placed upon underlying assembly 20 such that shield 18 is accurately positioned vertically and horizontally with respect to assembly 20. Light barrier 25 and light shield alignment and spacing member 65 increase the stability of the position of shield 18 while shield 18 is being placed, and after shield 18 has been placed, on assembly 20.

As is apparent by referring to FIG. 4, light shield alignment and spacing member 65 causes the underside of shield 18 to be spaced a predetermined distance apart from the top surface of assembly 20, and thereby to form a well-defined and accurate gap between the top surface of assembly 20 and the underside of shield 18. In tandem with light shield alignment and spacing member 65 forming a gap of accurate and continuous dimension across the top surface of assembly 20, the insertion of light barrier 25 into channel 72 causes shield 18 to be aligned accurately with respect to the edges and corners of assembly 20. Moreover, shield 18 can be configured for quick, stable and accurate placement over and upon assembly 20 by a vacuum-operated pick-and-place machine, or by any other suitable placement means such as by hand. In one embodiment, shield 18 is glued to assembly 20 using a suitable epoxy or other adhesive, although other means of securely fastening shield 18 to assembly 20 may also be employed.

According to one embodiment, portions 61 and 63 of shield 18 are purposely configured to be positioned slightly above and vertically offset from the topmost portions of lenses 27, 29 and 30. Such an arrangement helps prevent light originating from light emitter 12 leaking through or around lens 27 and shield 18 in the direction of lens 29 which might otherwise generate undesired crosstalk.

In one embodiment, shield 18 is formed of metal using the stamping and drawing techniques described above, but can also be formed of any suitable material such as ceramic or a polymer, or may be formed using any suitable process, such as injection molding or casting. Note further that light shield alignment and spacing member 65 can be situated on shield 18 such that it overlies the light emitting portion of assembly 20 instead of, or in addition to, the light detecting portion.

There is no requirement that light shield alignment and spacing member 65 extend at right angles from light barrier 25, or that light shield alignment and spacing member 65 form a single channel or groove. Instead, light shield alignment and spacing member 65 may comprise one or a plurality of a downwardly-projecting channels, ridges, grooves, v- or u-shaped grooves, channels, v- or u-shaped channels, rays, ridges, or standoffs or nubbins projecting downwardly from the underside of shield 18. Furthermore, light shield alignment and spacing member 65 need not be formed as a portion of shield 18, but instead may comprise one or more downwardly-projecting alignment members that are stamped, molded, attached, glued or otherwise formed to the underside of shield 18.

Referring now to FIGS. 5 through 8, it will be seen that optical proximity sensor 10 comprises substrate 11 having mounted thereon light emitter 16, which is operably connected to one of wire bond pads 41 via wire 43. According to one embodiment, light emitter 16 is a semiconductor infrared LED such as a Model No. TK116IRA TYNTEK™ AlGaAs/GaAs Infrared Chip, the data sheet for which is included in an Information Disclosure Statement filed on even date herewith and the entirety of which is hereby incorporated by reference herein. In one embodiment, substrate 11 is a printed circuit board having traces, wire bond pads and/or vias disposed thereon or therein. Conventional materials well known to those skilled in the art may be employed to form first substrate 11. Light detector 12 and ambient light detector 14 are operably connected to wire bond pads 75 and 76 via wires 75 and 78. According to one embodiment, light detector 12 is an AVAGO TECHNOLOGIES™ APDS-9120 integrated optical proximity sensor and ambient light detector 14 is an AVAGO TECHNOLOGIES™ APDS-9800 integrated ambient light and proximity sensor. Integrated circuit 35 is mounted on substrate 11 via wires 74 and wire bond pads 73, and is operably connected to light emitter 16, light detector 12 and ambient light sensor 14. According to one embodiment, integrated circuit 35 is an AVAGO TECHNOLOGIES™ APDS-9702 signal conditioning IC for optical proximity sensors, the data sheet for which is hereby incorporated by reference herein in its entirety.

Figure 5:
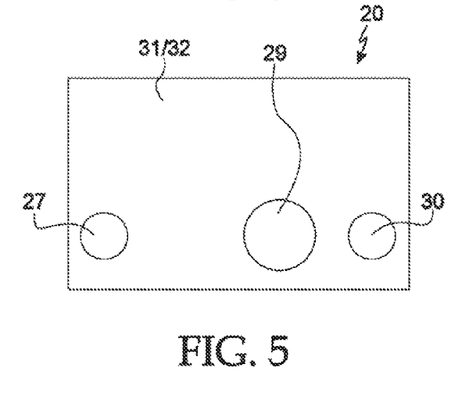
FIG. 5 shows a top view of one embodiment of a proximity sensor assembly 20 prior to the formation of channel 72.
Figure 6:
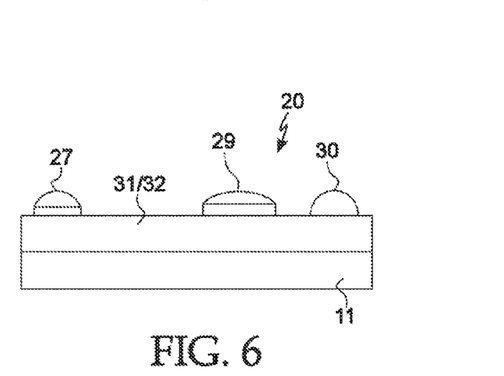
FIG. 6 shows a side view of one embodiment of a proximity sensor assembly 20 prior to the formation of channel 72.
Figure 7:
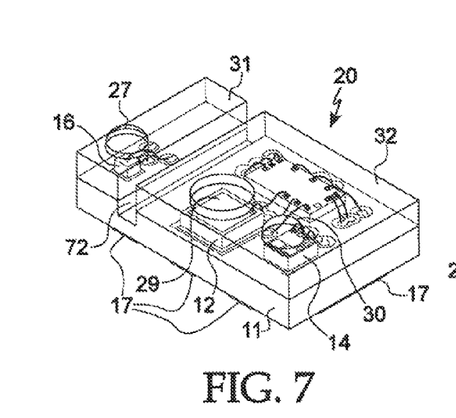
FIG. 7 shows a top perspective view of proximity sensor assembly 20 after the formation of channel 72.
Figure 8:
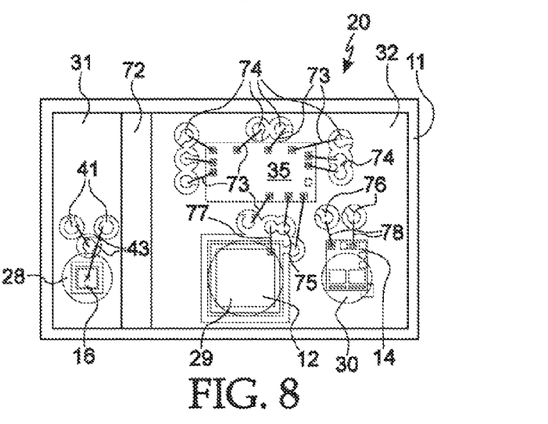
FIG. 8 shows a top view of proximity sensor assembly 20 after the formation of channel 72.

FIGS. 5 and 6 shows assembly 20 after a molded optically transmissive infrared light pass component 31/32 has been disposed over and covers light emitter 16, light detector 12 and ambient light detector 14. Note that molded optically transmissive infrared light pass component 31/32 may be shaped to include lenses 27, 29 and 30 as shown in FIGS. 5 and 6, where lenses 27, 29 and 30 are configured to collimate and direct light emitted by light emitter 12 and reflected from object to be detected 60 (not shown in FIGS. 5 and 6) inwardly towards light detector 12. Optical lenses 27, 29 and 30 of FIGS. 5 and 6 are preferably formed of the same material, and formed at the same time during the manufacturing process, and before channel 72 (see FIGS. 7 an 8) is formed according to one embodiment by cutting or sawing.

First and second molded optically transmissive infrared light pass components 31 and 32 seal and protect integrated circuit 35, light emitter 12, light detector 12 and ambient light sensor 14 disposed therewithin, and also provides a platform for shield 18 to mounted thereabove as discussed above. According to one embodiment, first and second molded optically transmissive infrared light pass components 31 and 32 are formed using an infrared-pass and optically transmissive transfer molding compound such as NITTO DENKO™ NT-8506 clear transfer molding compound 8506 or PENCHEM Technologies™ OP 579 infrared pass optoelectronic epoxy. Other suitable optically transmissive epoxies, plastics, polymers or other materials may also be employed. In some embodiments, optically transmissive infrared light pass components 31 and 32 are molded during the same manufacturing step, or may be molded separately. See Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009, both of which documents are hereby incorporated by reference herein, each in its respective entirety.

FIG. 9 shows fully assembled optical sensor 10 forming a single package. Infrared light rays emitted by light emitter or LED 16 exit sensor 10 through aperture 52, become incident upon an object to be detected 60 (see FIG. 1), are reflected from object 60 and return to light detector 12 for detection thereby. Ambient light sensor 14 detects ambient illumination levels or the presence or absence of a nearby object. In one embodiment, for example, ambient light sensor 14 is operably connected to a control circuit for a display, a keypad or a touchscreen in a portable electronic device. The control circuit modulates a functionality of the display, keypad or touchscreen in accordance with ambient light illumination levels detected by ambient light sensor 14. The functionality may be one or more of brightness, illumination, and on/off. Ambient light sensor 14 may also be configured to detect the presence of an object in proximity thereto and to have the control circuit modulate the functionality of the display, keypad or touchscreen in accordance with the detected presence of the object.

Figure 10:
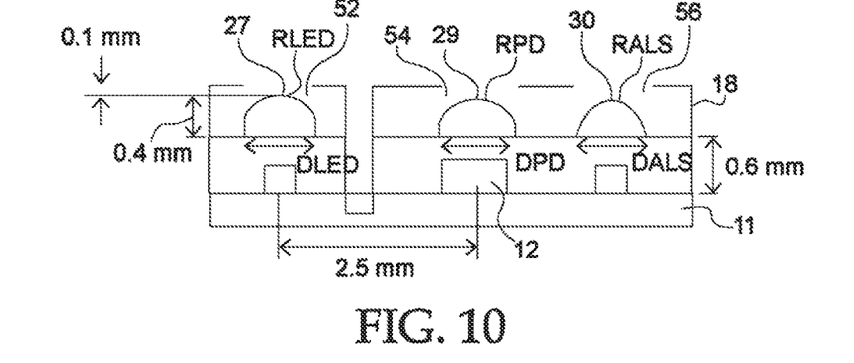
FIG. 10 shows a schematic cross-sectional view of one embodiment of proximity sensor assembly 20.

Referring now to FIG. 10, there is shown a cross-sectional schematic view of one embodiment of optical proximity sensor 10. As shown, lenses 27, 29 and 30 all exhibit a spherical profile. In one embodiment, light emitter lens 27 has a radius of about 0.43 mm and a diameter of about 0.8 mm, light detector lens 29 has a radius of about 1 mm and a diameter of about 1.2 mm, and ambient light sensor lens 30 has a radius of about 0.4 mm and a diameter of about 0.8 mm. Other spherical lens radii and diameters are of course contemplated. By way of example, light emitter lens 27 may range between about 0.4 mm and about 0.5 mm in radius, and between about 0.6 mm and about 1 mm in diameter. Light detector lens 29 may range between about 0.65 mm and about 1.5 mm in radius, and between about 0.9 mm and about 1.5 mm in diameter. Ambient light detector lens 30 may range between about 0.2 mm and about 0.6 mm in radius, and between about 0.6 mm and about 1.0 mm in diameter. Note further that the embodiment shown in FIG. 10 features a center-to-center lens distance between light emitter lens 27 and light detector lens 29 of about 2.5 mm, although other center-to-center lens distances may also be used.

Figure 11:
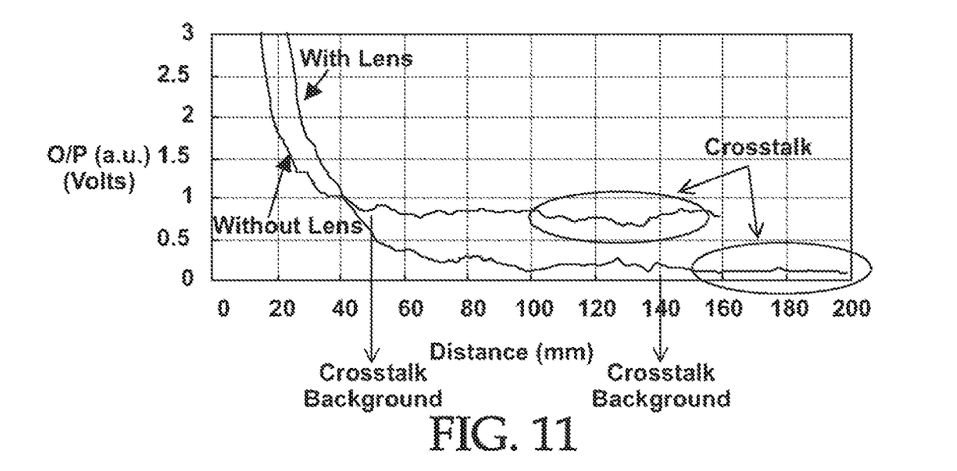
FIG. 11 shows test results obtained with unlensed and lensed proximity sensors.

The advantageous and efficacious lens configurations shown in FIGS. 5, 6, 7, 8 and 10 have been discovered to provide surprisingly good results with respect to crosstalk suppression and increasing detection distance. FIG. 11 shows detection signals generated using otherwise identical proximity sensors with no lenses disposed over light emitter 12 and light detector 14 (see curve labelled "without lenses") and with spherical lenses disposed over light emitter 12 and light detector 14 (see curve labelled "with lenses").

Figure 12:
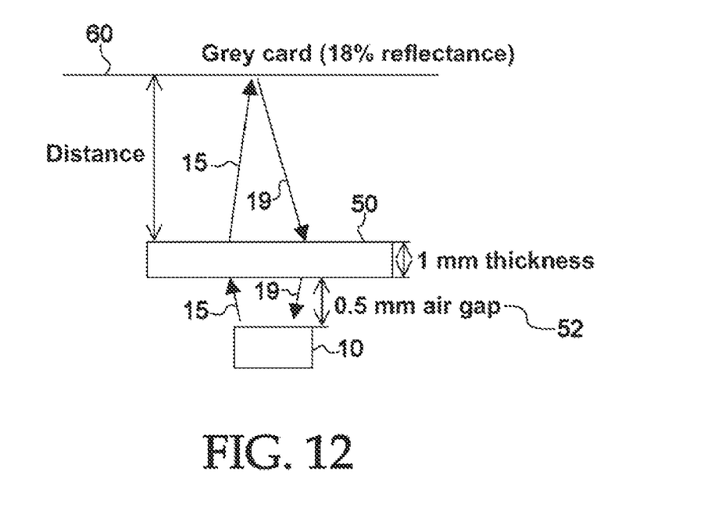
FIG. 12 shows the test configuration employed to generate the test data shown in FIG. 11.

The graph shown in FIG. 11 was generated using the test set-up illustrated in FIG. 12, where a standard 18% grey reflectance card acting as object to be detected was positioned over proximity sensor 10, and intervening optically transmissive window 50 1 mm thick was positioned 0.5 mm above sensor 10 and between sensor 10 and the grey card. The card was then moved to various distances away from sensor 10 and detection signals were generated by proximity sensor 10.

As shown in the graph of FIG. 11, at a grey card distance of about 50 mm from the proximity sensor equipped without spherical lenses crosstalk becomes indistinguishable from detection signals, meaning that the effective distance over which the proximity sensor not equipped with spherical lenses can detect an object to be detected 60 is limited to about 50 mm. On the other hand, at a grey card distance of about 140 mm from the proximity sensor equipped with spherical lenses crosstalk becomes indistinguishable from detection signals, meaning that the effective distance over which the proximity sensor equipped with spherical lenses can detect an object to be detected 60 is almost three times that of an otherwise identical proximity sensor not equipped with spherical lenses.

These impressive results show that light emitted by light emitter 16 is efficiently collected and directed upwardly from proximity sensor by spherical lens 27, reflected light incident on lens 29 is efficiently collected and directed downwardly for detection by light detector 12, and spurious undesired light scattered, reflected or diffracted from, or refracted through, window 50 or through or around light barrier 25 is effectively minimized by the optical proximity sensor 10 of FIG. 9.

According to various embodiments, lensed optical proximity sensor 10 may be configured to detect object to be detected 60 at distances exceeding about 50 mm, exceeding about 75 mm, and/or exceeding about 100 mm.

In many applications in which optical proximity sensors 10 are employed, an optically transmissive material such as piece of plastic or glass forming window 50 is placed above proximity sensor 10, which in turn is mounted within a device such as a portable electronic device such as a smart phone, a mobile phone, a portable or laptop computer, a computer or a Personal data Assistance (PDA). One function of window 50 can be to protect sensor 10 and other circuitry and electronic or electrical components disposed within the device. Another function of window 50 may be to provide mechanical strength to the device, or to improve its cosmetic appearance. In such applications, window 50 basically constitutes an undesired secondary optical system, and can cause unwanted crosstalk which becomes especially apparent in the absence of object to be detected 60.

In a proximity sensor having no lens disposed over light emitter 16, the output beam of the LED is large, which leads to an even greater crosstalk signal. In some cases, crosstalk in an optical proximity sensor can cause the output provided by light detector 12 to become fully saturated even when object 60 is outside detection range.

In lensed proximity sensor 10 of FIG. 9, the angle of the beam emitted by light emitter 16 is narrowed by lens 27, and crosstalk is correspondingly reduced. In addition, because the signal reflected from object 60 usually blooms or diffuses while being reflected from object 60, lens 29 disposed over light detector 12 helps to focus light rays incident on lens 29 towards the active area of light detector 12. Lensed proximity sensor 10 also permits for more flexible tolerances in overall system design.

It has been discovered that placing proximity sensor 10 close to window 50 can also reduce crosstalk. Ideally, proximity sensor 10 would be placed immediately adjacent window 50 such that there is no gap between sensor 10 and window 50. This, however, is rarely achievable from a practical standpoint. In many devices, a typical minimum tolerance for air gap 52 is about 0.2 mm. It has been discovered that lensed proximity sensor 10 of FIG. 9 permits larger air gaps 52 to be disposed between sensor 10 and window 50 than have heretofore been possible. In fact, depending on the thickness of window 50, unusually large air gaps 52 of between about 0.5 mm and 1 mm can be achieved with lensed optical proximity sensor 10 of FIG. 9 without significantly compromising performance.

In addition, the thicker window 50 becomes, the greater the amount of crosstalk typically generated thereby. One advantage of lensed optical proximity sensor 10 of FIG. 9 is that much thicker windows 50 than heretofore has been possible may be employed in conjunction therewith. Window thickness becomes important in applications where windows as thick as 1.35 mm—or even thicker—are increasingly becoming employed in some devices.

Lensed proximity sensor 10 of FIG. 9 also increases the detection distance that may be achieved by proximity sensor 10 by a surprising amount. Because lenses 27 and 29 concentrate the intensity of emitted and received light beams over narrower angles, light intensity along the optical axes of lenses 27 and 29 is relatively high. This allows the emitted beam to travel a longer distance away from proximity sensor 10 to hit target 60, and for the beam reflected therefrom to carry sufficient energy to be detected by light detector 12. The heightened intensities of the emitted and reflected light beams of proximity sensor 10 of FIG. 9 permit lower light emitter drive currents to be employed, which in turn reduces the overall electrical power consumption of the device within which proximity sensor 10 is disposed and to which proximity sensor 10 is operably connected.

Figure 13:
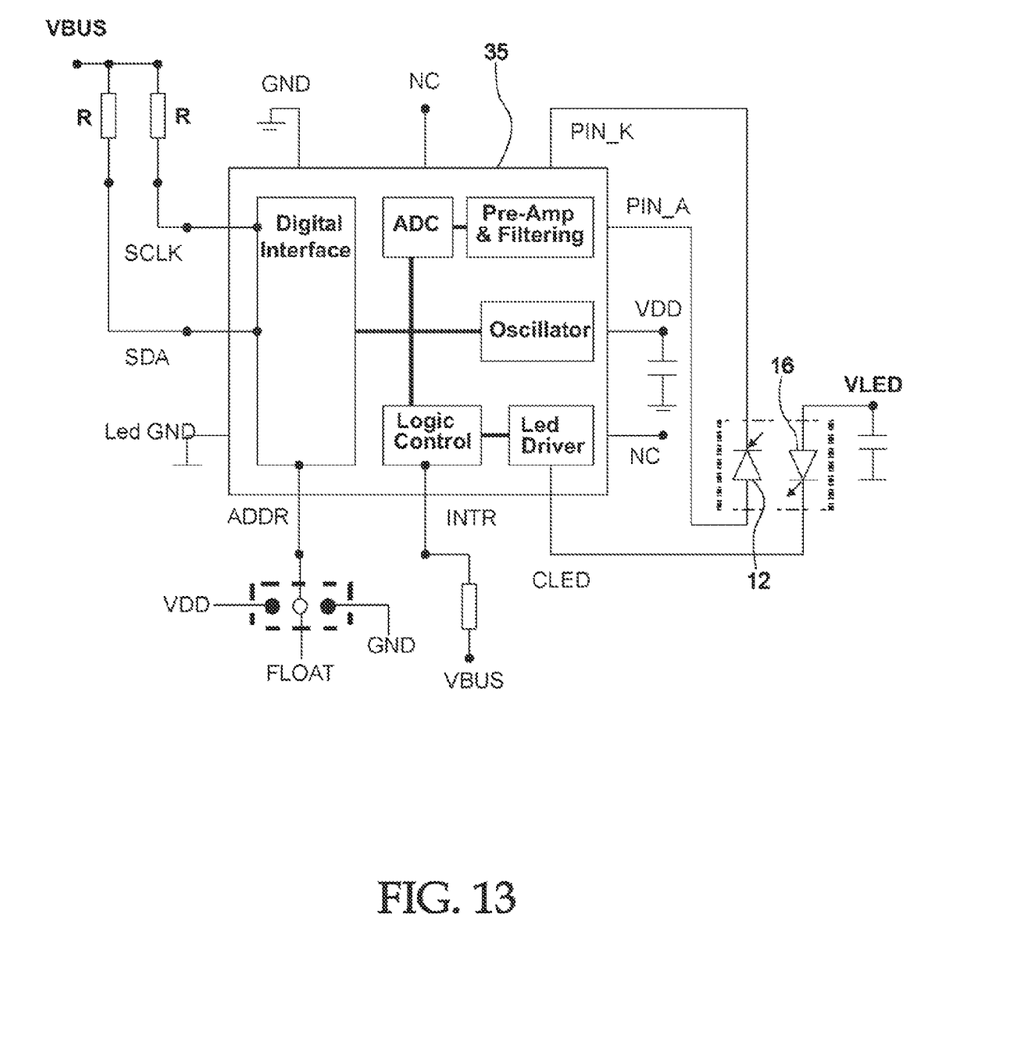
FIG. 13 shows one embodiment of circuitry for integrated circuit 35 and optical proximity sensor 10.

FIG. 13 shows one embodiment of circuitry associated with integrated circuit 35 and proximity sensor 10, which in the illustrated embodiment is an Avago Technologies APDS 9702 signal conditioning integrated circuit. Other embodiments of such circuitry are contemplated.

Figure 14:
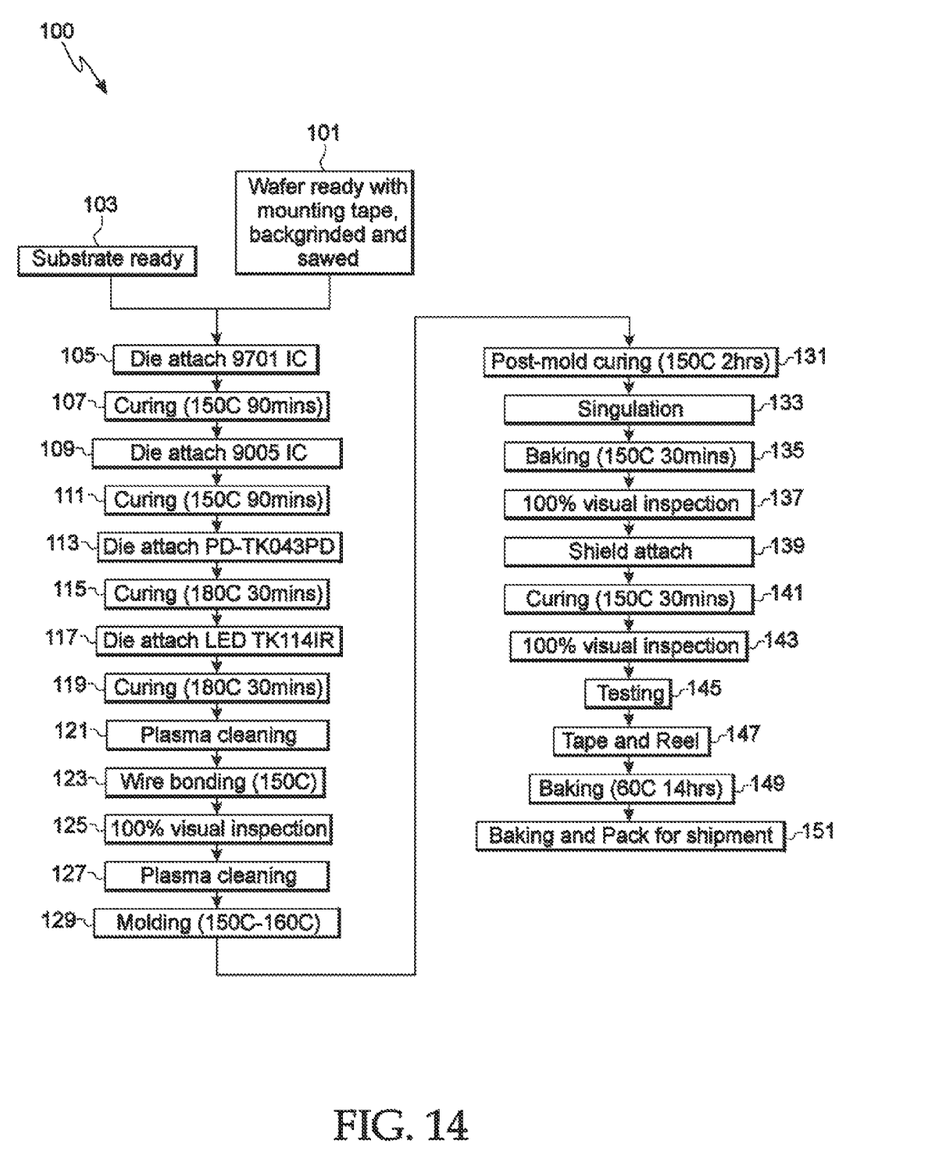
FIG. 14 shows one embodiment of method 100 for making optical proximity sensor 10.

FIG. 14 illustrates one embodiment of method 100 for making proximity sensor 10 of FIG. 9. Method 100 starts by preparing and providing substrates 11 at step 103, and at step 101 preparing and providing semiconductor wafers containing integrated circuits 35 (Avago Technologies 9701 IC), LEDs 16 (LED TK114IR), light detectors 12 (PD-TK043PD), and ambient light sensors 14 (Avago Technologies 9005 IC), which are mounted on blue tape, backgrinded and diced. Individual dice 35 (9701 ICs) are attached to substrates 11 in step 105 using an electrically non-conductive epoxy such ABLESTIK™ 2025. The epoxy is cured in step 107. Next, individual dice 14 (9005 ICs) are attached to substrates 11 in step 109 using an non-conductive epoxy such ABLESTIK™ 2025. The epoxy is cured in step 111. Individual dice 12 (PD-TK043PD) are attached to substrates 11 in step 113 using an electrically conductive epoxy such as FDP5053 or FDP5100. The epoxy is cured in step 115. Next, individual dice 16 (LED TK114IR) are attached to substrates 11 in step 117 using an electrically conductive epoxy such as FDP5053 or FDP5100. The epoxy is cured in step 119. After die attachment, plasma cleaning is conducted at step 121 to clean the surfaces of substrates 11, and especially the wire bonding surfaces thereof, before wire bonding is conducted at step 123. After wire bonding, 100% visual inspection is conducted at step 125 to verify bond quality and integrity. After visual inspection, a second plasma cleaning step 127 is conducted. Next, a molding process is conducted at step 129 using NT8506 clear or infrared pass compound, followed at step 119 by post-mold curing at step 131. After curing, substrates 11 are diced and singulated at step 133, which are then and baked at step 135. After baking, 100% visual inspection is conducted at step 137. At step 139 shields 18 are attached and glued to assemblies 20, followed by curing at step 141. 100% visual inspection is again conducted at step 143, followed by final functional testing performed on individual sensors 10 at step 145. After testing, individual sensors 10 that have passed tests performed at step 145 are placed on tapes and reels at step 147, baked at step 149, and then packed for shipment at step 151.

Note that other methods for making optical proximity sensor 10 are also contemplated, and that the order of the steps shown in FIG. 14 may be changed.

The molding processes described above include transfer molding methods where thermosetting materials are softened by heat and pressure in a transfer chamber, and then forced at high pressure through suitable sprues, runners, and gates into a closed mold for final curing.

Included within the scope of the present invention are methods of making and having made the various components, devices and systems described herein.

Those skilled in the art will understand that the various embodiments of the proximity sensor disclosed herein may be incorporated into portable electronic devices such as mobile telephones, smart phones, personal data assistants (PDAs), laptop computers, notebook computer, computers and other devices.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor, comprising:
an infrared light emitter mounted on a substrate;
an infrared light detector mounted on the substrate;
an integrated circuit mounted on the substrate and comprising light emitter driving and light detecting circuits operably connected to the light emitter and the light detector, respectively;
a first spherical lens disposed over the light emitter and configured to collect and direct light emitted by the light emitter in an upward direction towards an object to be detected;
a second spherical lens disposed over the light detector and configured to collect and direct light incident thereon that has been transmitted upwardly by the first lens and reflected downwardly from the object to be detected towards the light detector, and
a light shield disposed over the light emitter, the light detector, the first lens and the second lens, the light shield comprising first and second top portions, a light barrier projecting downwardly between the first and second top portions to separate the light emitter from the light detector and divide the proximity sensor into light emitting and light detecting portions, at least one light shield alignment and spacing member projecting downwardly from either the first portion or the second portion, and first and second apertures disposed through the first and second portions over the first and second lenses, respectively;
wherein alignment of the shield over the proximity sensor is optimized by the light barrier and the at least one light shield alignment and spacing member, crosstalk between the light emitter and the light detector is minimized, and detection distance of the proximity sensor is maximized by the configurations of the light emitter, the first lens, the light detector, the second lens, and the shield respecting one another.

2. The optical proximity sensor of claim 1, further comprising an ambient light sensor disposed in the light detecting portion.

3. The optical proximity sensor of claim 2, wherein the ambient light sensor is operably connected to a control circuit for a display, a keypad or a touchscreen in a portable electronic device.

4. The optical proximity sensor of claim 3, wherein the control circuit modulates a functionality of the display, keypad or touchscreen in accordance with ambient light illumination levels detected by the ambient light sensor.

5. The proximity sensor of claim 4, wherein the functionality is one of brightness, illumination, and on/off.

6. The optical proximity sensor of claim 3, wherein the ambient light sensor is configured to detect the presence of an object in proximity thereto and the control circuit modulates the functionality of the display, keypad or touchscreen in accordance with the detected presence of the object.

7. The optical proximity sensor of claim 3, wherein a third spherical lens is disposed over the ambient light sensor and a third aperture is disposed through the second portion of the shield over the ambient light sensor.

8. The optical proximity sensor of claim 1, wherein the proximity sensor is configured to detect the object to be detected at distances exceeding about 50 mm.

9. The optical proximity sensor of claim 1, wherein the proximity sensor is configured to detect the object to be detected at distances exceeding about 75 mm.

10. The optical proximity sensor of claim 1, wherein the proximity sensor is configured to detect the object to be detected at distances exceeding about 100 mm.

11. The optical proximity sensor of claim 1, wherein the at least one light shield alignment and spacing member forms one or a plurality of downwardly-projecting grooves, v- or u-shaped grooves, channels, v- or u-shaped channels, rays, ridges, standoffs or nubbins.

12. The optical proximity sensor of claim 1, wherein at least one of the light emitter and the light detector is a semiconductor die.

13. The optical proximity sensor of claim 1, wherein the integrated circuit is an application specific integrated circuit ("ASIC").

14. The optical proximity sensor of claim 1, wherein the optical proximity sensor is incorporated into a portable electronic device.

15. The optical proximity sensor of claim 14, wherein the portable electronic device is a smart phone, a mobile telephone, a personal data assistant (PDA), a laptop computer, a notebook computer, or a computer.

16. The optical proximity sensor of claim 14, wherein an optically transmissive window is disposed above the proximity sensor.

17. The optical proximity sensor of claim 14, wherein a gap between the optically transmissive window and the proximity sensor is less than or equal to 1 mm.

18. The optical proximity sensor of claim 14, wherein a gap between the optically transmissive window and the proximity sensor is less than or equal to 0.5 mm.

19. The optical proximity sensor of claim 1, wherein at least one of the first and second lenses is molded from an optically transmissive material.

20. The optical proximity sensor of claim 1, wherein a distance between a first center of the first lens and a second center of the second lens ranges between about 2.0 mm and about 3.0 mm.

21. The optical proximity sensor of claim 1, wherein the sensor has a height of about 1 mm.

22. The optical proximity sensor of claim 1, wherein the top surface of the shield is located above uppermost portions of the first and second lenses.

23. A method of making an optical proximity sensor, comprising:

mounting an infrared light emitter on a substrate;

mounting an infrared light detector on the substrate;

mounting an integrated circuit comprising light emitter driving and light detecting circuits on the substrate and operably connecting the circuits to the light emitter and the light detector;

placing or forming a first spherical lens over the light emitter, the first lens being configured to collect and direct light emitted by the light emitter in an upward direction towards an object to be detected;

placing or forming a second spherical lens over the light emitter, the second lens being configured to collect and direct light incident thereon that has been transmitted upwardly by the first lens and reflected downwardly from the object to be detected towards the light detector, and disposing a light shield over the light emitter, the light detector, the first lens and the second lens, the light shield comprising first and second top portions, a light barrier projecting downwardly between the first and second top portions to separate the light emitter from the light detector and divide the proximity sensor into light emitting and light detecting portions, at least one light shield alignment and spacing member projecting downwardly from either the first top portion or the second top portion, and first and second apertures disposed through the shield over the first and second lenses, respectively;

wherein alignment of the shield over the proximity sensor is optimized by the light barrier and the at least one light shield alignment and spacing member, crosstalk between the light emitter and the light detector is minimized, and detection distance of the proximity sensor is maximized, by the configurations of the light emitter, the first lens, the light detector, the second lens, and the shield respecting one another.

24. The method of claim 23, further comprising incorporating the proximity sensor into a portable electronic device.

25. The method of claim 24, wherein the portable electronic device is a smart phone, a mobile telephone, a personal data assistant (PDA), a laptop computer, a notebook computer, or a computer.

* * * * *